United States Patent
Chang (10) Patent No.: US 6,178,533 B1
(45) Date of Patent: Jan. 23, 2001

(54) METHOD AND SYSTEM FOR DESIGN VERIFICATION

(75) Inventor: Lawrence L. Chang, Palo Alto, CA (US)

(73) Assignee: Sun Microsystems, Inc., Mountain View, CA (US)

( * ) Notice: Under 35 U.S.C. 154(b), the term of this patent shall be extended for 0 days.

(21) Appl. No.: 08/885,160

(22) Filed: Jun. 30, 1997

(51) Int. Cl.$^7$ ..................................... G01R 31/28
(52) U.S. Cl. ..................... 714/739; 714/741; 714/32
(58) Field of Search .................. 371/22.3, 25.1, 371/27.1, 27.2, 27.4, 27.5; 395/183.01, 183.06, 183.08, 183.09, 183.13; 364/578, 264.3; 714/726, 728, 736, 738, 739, 741, 742, 25, 30, 32, 33, 37

(56) References Cited

U.S. PATENT DOCUMENTS

| | | | |
|---|---|---|---|
| 5,202,889 | 4/1993 | Aharon et al. | 371/27 |
| 5,414,716 * | 5/1995 | Bershteyn | 371/27.1 |
| 5,572,666 | 11/1996 | Whitman | 395/183.08 |
| 5,729,554 * | 3/1998 | Weir et al. | 371/27.2 |

* cited by examiner

Primary Examiner—Trinh L. Tu
(74) Attorney, Agent, or Firm—Pennie & Edmonds LLP (57) ABSTRACT

The present invention pertains to a dynamic process for generating biased pseudo-random test patterns for the functional verification of a microprocessor having a bus interface unit that is capable of direct memory access (DMA) operations between I/O devices attached to an external bus and the microprocessor's memory. The test patterns verify memory operations performed by the microprocessor and DMA operations received by the microprocessor's bus interface unit. These test patterns can then be used by a simulation mechanism to simulate the expected results of the target microprocessor running the generated sequence of transactions. The test verification system categorizes the verifiable operations into transactions. Each transaction is assigned a user-defined weight that is used to bias the frequency that a transaction is tested. The test verification system selects a particular transaction category based on the user-defined weights and generates the corresponding instructions or test patterns that implement the transaction.

12 Claims, 7 Drawing Sheets

WEIGHTS FILE

138

| 140 | 142 | | |
|---|---|---|---|
| bcu_prim_s1_io | 10 | --| | BCU to bus agents connected to primary |
| bcu_prim_s2_io | 15 | | | bus, secondary bus A, and secondary bus B |
| bcu_prim_s1_mem | 10 | | | |
| bcu_prim_s2_mem | 15 | | | |
| bcu_prim_s1_config | 10 | | | |
| bcu_prim_s2_config | 15 | | | |
| bcu_busa_s1_io | 10 | | | |
| bcu_busa_s2_io | 15 | | 146 | |
| bcu_busa_s1_mem | 10 | | | |
| bcu_busa_s2_mem | 15 | | | |
| bcu_busa_s1_config | 10 | | | |
| bcu_busa_s2_config | 15 | | | |
| bcu_busb_s1_io | 10 | | | |
| bcu_busb_s2_io | 15 | | | |
| bcu_busb_s1_mem | 10 | | | |
| bcu_busb_s2_mem | 15 | | | |
| bcu_busb_s1_config | 10 | | | |
| bcu_busb_s2_config | 15 | --| | |
| | | | | |
| cachable_mem | 45 | --| | Microprocessor to Cacheable Memory |
| noncachable_mem | 30 | | 148 | Microprocessor to FFB |
| cache_flush | 33 | | | Cache Flush |
| cache_prefetch | 20 | --| | Cache Prefetch |
| | | | | |
| bcu_prim_m1_noise | 5 | --| | |
| bcu_prim_m2_noise | 5 | | | |
| bcu_busa_m1_noise | 5 | | | BUS NOISE TRAFFIC |
| bcu_busa_m2_noise | 5 | | 150 | |
| bcu_busb_m1_noise | 5 | | | |
| bcu_busb_m2_noise | 5 | --| | |
| | | | | |
| prim_m1_dma_cacheable | 20 | --| | |
| prim_m1_dma_ffb | 10 | | | |
| prim_m2_dma_cacheable | 20 | | 152 | |
| prim_m2_dma_ffb | 10 | | | |
| busa_m1_dma_cacheable | 20 | | | DMA OPERATIONS |
| busa_m1_dma_ffb | 10 | | | |
| busa_m2_dma_cacheable | 20 | | | |
| busa_m2_dma_ffb | 10 | | | |
| busb_m1_dma_cacheable | 20 | | | |
| busb_m1_dma_ffb | 10 | | | |
| busb_m2_dma_cacheable | 20 | | | |
| busb_m2_dma_ffb | 10 | --| | |

156
```
setx 0x34253 %r16, %r21
or %r0, 0xf1, %r4
stb %r4, [%r21 + 0x3f]
 . . .
cacheable_memory_start:
      .word 0x321acc56, 0x9cf7b18b, 0x0e0ef651, 0x827c6244
      .word 0x88373e2a, 0xcfa624f0, 0x72fc4668, 0x08581ec4
      .word 0x321acc56, 0x9cf7b18b, 0x0e0ef651, 0x827c6244
      .word 0x88373e2a, 0xcfa624f0, 0x72fc4668, 0x08581ec4
cacheable_memory_end:
      . . .
```

FIGURE 6

158
```
read_cycle(mem_read_line,'h81284010,16,'hf,'hxxxxxxxx,6,'false);
read_continue('ha,'hxx82xxff,6);
read_continue('ha,'hxx82xxff,6);
read_continue('ha,'hxx82xxff,6);
read_continue('ha,'hxx82xxff,6);
read_continue('ha,'hxx82xxff,6);
read_continue('ha,'hxx82xxff,6);
read_continue('ha,'hxx82xxff,6);
read_continue('ha,'hxx82xxff,6);
      . . .
```

METHOD AND SYSTEM FOR DESIGN VERIFICATION

BRIEF DESCRIPTION OF THE INVENTION

The present invention relates generally to systems and methods for design verification of electronic circuits. More particularly, the invention relates to pseudo-random testing of electronic circuits that may be used in computers or other processing machines.

BACKGROUND OF THE INVENTION

During the development and manufacture of electronic circuits, there is a need to vigorously test various designs and products before release to customers. Ideally, the performance of an electronic circuit, for example a microprocessor, is verified for all possible circumstances under which it might be operated in the real world. Unfortunately, this would involve exhaustively testing a potentially infinite number of machine operation sequences and therefore require a prohibitively long time to generate and run test sequences.

To sample a wide range of possible machine operation sequences for design verification, random instruction generators were developed. These systems simply generate a random sampling of instructions (typically in the microprocessor's assembly language) which is then converted to machine code and tested on the microprocessor. Typically the instructions that are tested are limited to those instructions that test the functionality of the microprocessor's internal units.

However, these generators suffer from several limitations. Although such systems can provide a wide range of possible microprocessor operations with minimal user input, they have no understanding of what operation sequences are likely to be encountered in the real world. Further, they do not understand which operation sequences might be most difficult for the microprocessor to handle. Thus, they sometimes fail to adequately test important aspects of a microprocessor's functioning.

Another limitation is that the functionality of the microprocessor in executing externally-generated requests cannot be tested. The current trend is for microprocessors to include a bus interface unit to handle data requests from devices connected to the microprocessor's external bus. The random instruction generators normally do not generate instructions to test the microprocessor's behavior in responding to these external devices.

Accordingly, there exists a need for a test verification system that can overcome these shortcomings.

SUMMARY OF THE INVENTION

The present invention pertains to a dynamic process for generating biased pseudo-random test patterns for the functional verification of integrated circuit designs. In a preferred embodiment of the present invention, test patterns are generated to verify the functionality of a microprocessor having a bus interface unit that is capable of direct memory access (DMA) operations between I/O devices attached to an external bus and the microprocessor's memory. The test patterns can verify the microprocessor's functionality, particularly the memory operations performed by the microprocessor and DMA operations performed by the microprocessor's bus interface unit. These test patterns can then be used by a simulation mechanism to simulate the expected results of the target microprocessor design executing the generated sequence of transactions.

Two sets of test patterns are generated by the test verification system. The first set of test patterns are assembly code instructions written in the microprocessor's instruction set which test memory operations initiated by control units located within the microprocessor. In addition, the first set of test patterns include memory initialization and memory mapping instructions. The second set of test patterns are instructions that test DMA operations initiated from external I/O devices connected to the microprocessor.

The test verification system categorizes the verifiable operations into transactions. Each transaction consists of one or more instructions. Each transaction is assigned a user-defined weight that is used to bias the frequency that a transaction type is tested. The test verification system selects a particular transaction category based on the user-defined weights and generates the corresponding instructions or test patterns that implement the transaction.

The present invention is beneficial for several reasons. First, it is capable of verifying DMA operations initiated from external I/O devices connected to the microprocessor. Further, it provides the user with the capability of selecting those transactions that are to be tested more frequently than others by utilizing user defined weight factors.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
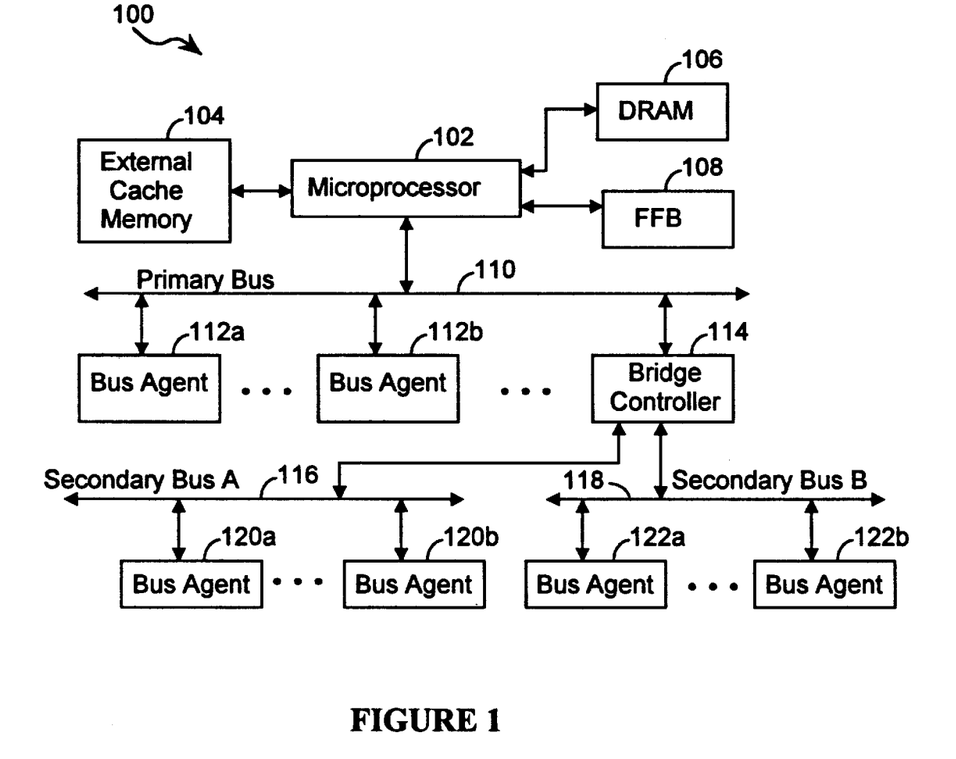
FIG. 1 illustrates an exemplary target computer system that is to be verified by the present invention.

FIG. 1 illustrates an architecture of an exemplary computer system 100 that can be the subject of the test verification system of the present invention. The computer system 100 includes a microprocessor 102 connected to an external cache memory (ECM) 104, a dynamic random memory (DRAM) device 106, and a fast frame buffer (FFB)108. The external cache memory 104 and DRAM 106 are cacheable memory devices. The fast frame buffer 108 is a non-cacheable memory device that is used to support graphics devices.

The microprocessor 102 is connected to a primary external bus 110 having a number of bus agents 112 or I/O devices. Each of the bus agents 112 can initiate DMA operations to the microprocessor 102. The primary bus 110 is also connected to a bridge controller 114 that provides a data path between the primary bus 110 and two secondary buses 116, 118 running at a slower speed than the primary bus 110. Each of the secondary buses 116, 118 are connected to bus agents 120, 122 having the capability to exercise DMA operations with the microprocessor 102.

Figure 2:
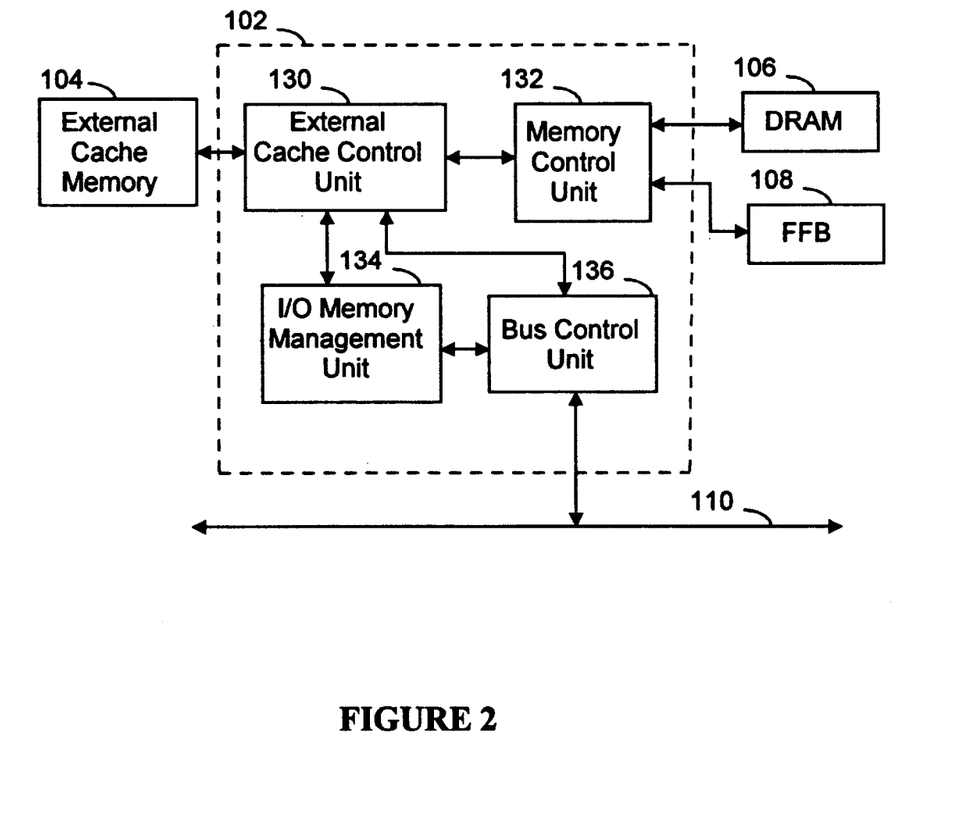
FIG. 2 illustrates some of the components associated with the microprocessor shown in FIG. 1.

FIG. 2 illustrates some of the components of the microprocessor 102. There is an external cache unit (ECU) 130 that manages the external cache memory 104. The memory control unit (MCU) 132 manages all requests to the DRAM 106 and the FFB 108. The bus control unit (BCU) 136 interfaces the microprocessor 102 with the primary bus 110. An I/O memory management unit (IOM) 134 maps a virtual memory address to a physical memory address for DMA operations between the bus agents 112, 120, 122 and the microprocessor 102 through the BCU 136. The BCU 136 interacts with the ECU 130, MCU 132, and IOM 134 for DMA transfers and controls the DMA buffers (not shown) used in the data transfer.

The test verification system of the present invention can be used to verify the memory operations performed by the microprocessor 102 and DMA operations between the various bus agents 120, 112, 122 and the microprocessor 102. However, it should be noted that the test verification system is not constrained to verifying these particular functions and that it can be used to verify all the operations of the microprocessor. These particular operations are selected for illustration purposes only.

For the exemplary computer system shown in FIGS. 1 and 2, the non-DMA memory operations can include the following: load and stores to and from the cacheable memory, DRAM and ECM; load and stores to and from the non-cacheable memory, FFB; data transfers to and from the MMU and ECU to and from the BCU; cache flushes; cache prefetches; and the like.

The DMA operations can include read and write requests for data stored in the cacheable 104, 106 or non-cacheable 108 memories from any of the bus agents 112, 120, 122 connected to either the primary 110 or secondary 116, 118 buses.

Figure 3:
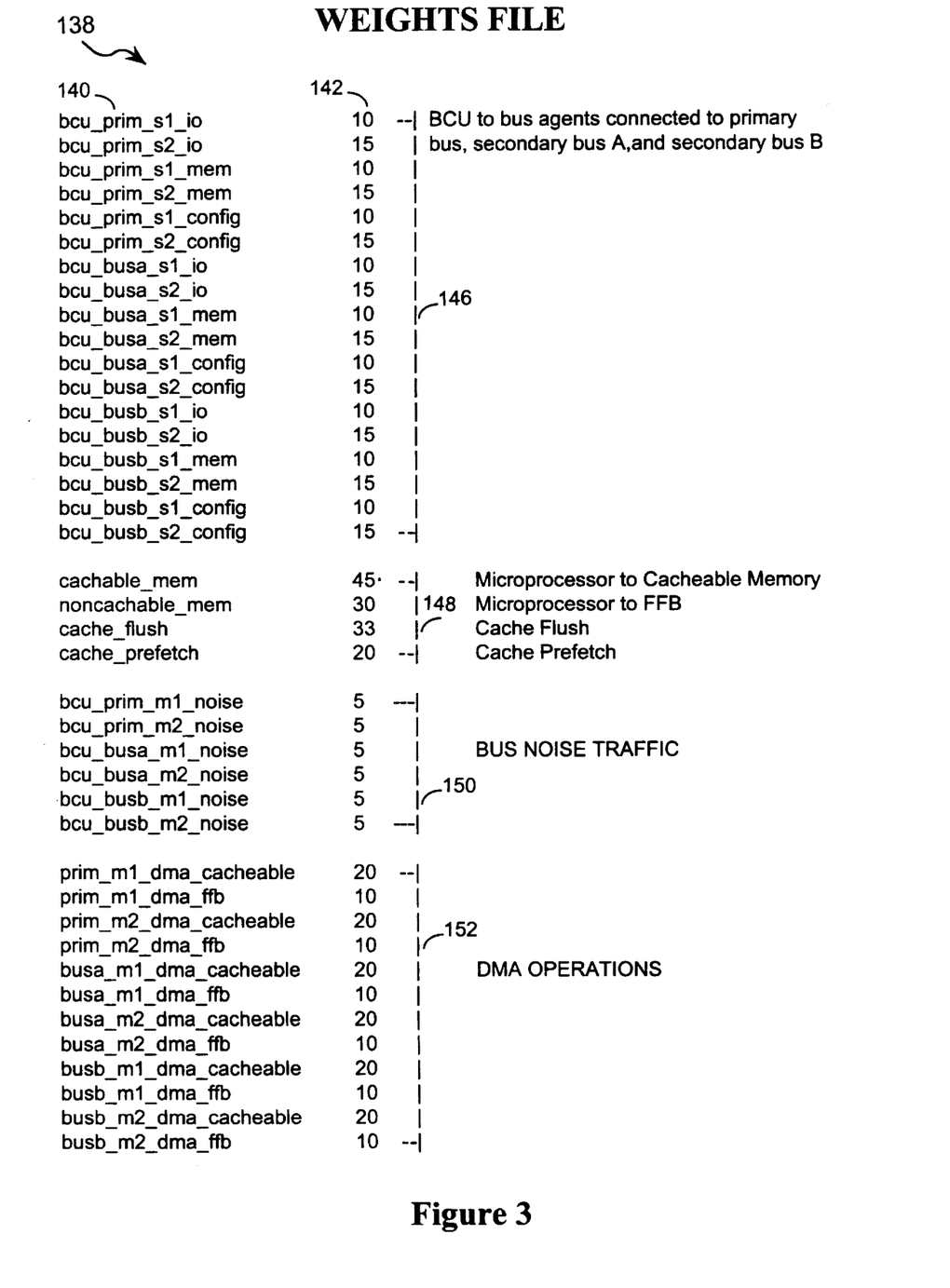
FIG. 3 is an exemplary weights file in accordance with an embodiment of the present invention.

These memory operations are categorized into transactions. Each transaction can represent one or more instructions or commands. A transaction is assigned a weight which is used to bias the frequency that the transaction is tested. A weight file, preferably generated by a user, is used to define the types of transactions to be tested and their associated weights. FIG. 3 illustrates an exemplary weight file.

FIG. 3 shows a listing of transactions 140 and their associated weights 142. A first category 146 of transactions represent operations exercising the bus control unit 136 and the IOM unit 134. For example, bcu_prim_s1_io represents an I/O transaction between the bus control unit and a first slave bus agent associated with the primary bus. As another example, bcu_busa_s1_mem represents a memory transaction between the bus control unit and a first slave bus agent associated with secondary bus A. Similarly, bcu_busb_s2_configuration represents a configuration transaction between the bus control unit and a second slave bus agent associated with the secondary bus B.

A second category 148 of transactions represent operations exercising the data paths between the ECU 130 and MCU 132 to the cacheable 104, 106 and non-cacheable memory 108. For example, cacheable_mem represents a memory transaction that utilizes one of the cacheable memory devices. Likewise, noncacheable_mem represents a memory transaction that utilizes the noncacheable memory or FFB.

A third category 150 of transactions exercise traffic between bus agents 112 on the primary bus 110. For example, bcu_prim_m1_noise represents a transaction between a master bus agent and a slave bus agent connected on the primary bus. Likewise, bcu_busa_m1_noise represents a transaction between a master bus agent and a slave bus agent connected on secondary bus A.

Another category of transactions 152 exercise the various DMA memory operations. For example, prim_m1_dma_cacheable represents a DMA memory operation initiated from a master bus agent associated with the primary bus for data in one of the cacheable memories. Likewise, busa_m1_dma_ffb represents a DMA memory operation from a master bus agent associated with the secondary bus A for data in the non-cacheable memory or the FFB.

A user enters into the weight file 138 the types of transactions that are to be tested as well as the frequency that each transaction is to be tested by setting the associated weight 142 accordingly. The use of the weights 142 will be described in more detail below.

Figure 4:
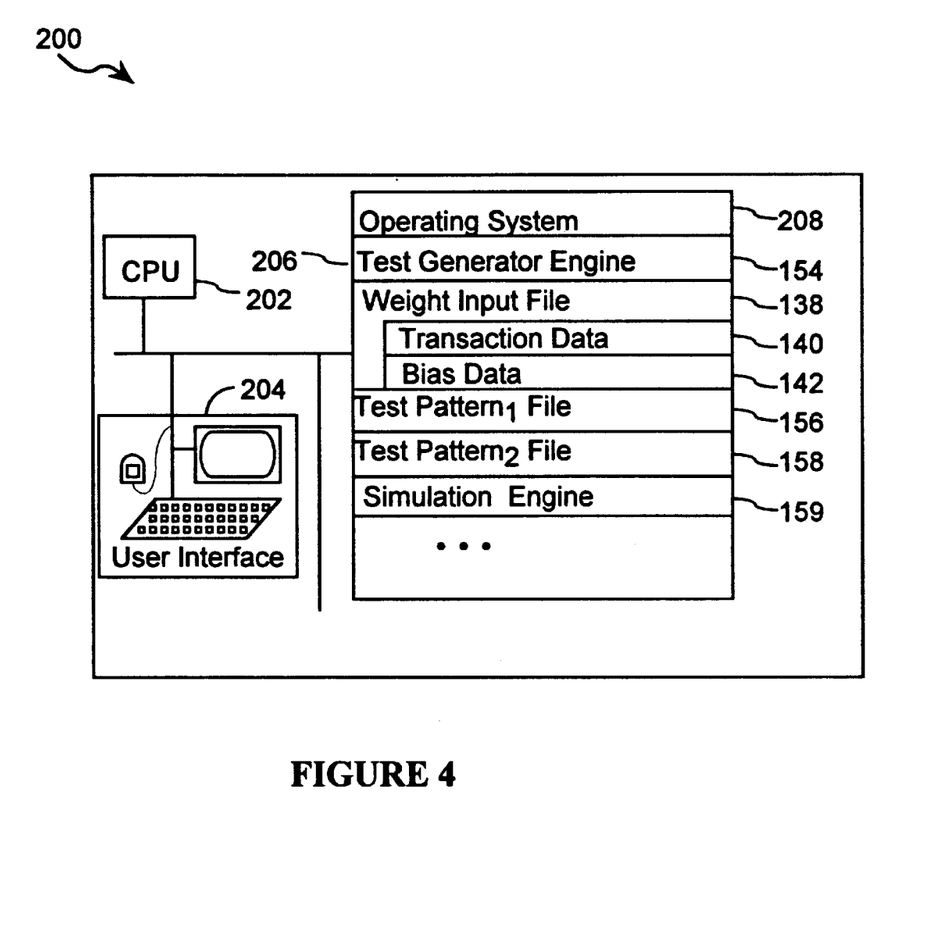
FIG. 4 illustrates the test verification system of an embodiment of the present invention.

FIG. 4 illustrates the test verification system 200 in an embodiment of the present invention. In a preferred embodiment, the test verification system 200 is a computer system having a central processing unit (CPU) 202, a user interface 204, a primary memory 206, as well as other system resources known in the art. The primary memory 206 may be implemented as RAM (random access memory) or a combination of RAM and non-volatile memory such as magnetic disk storage. The primary memory 206 can contain the following:

an operating system 208;
a test generator engine 154;
a weight input file 138 including transaction data 140 and bias data 142;
a first test pattern file 156;
a second test pattern file 158;
a simulation engine 159;
as well as other data, files, and procedures.

Figure 5:
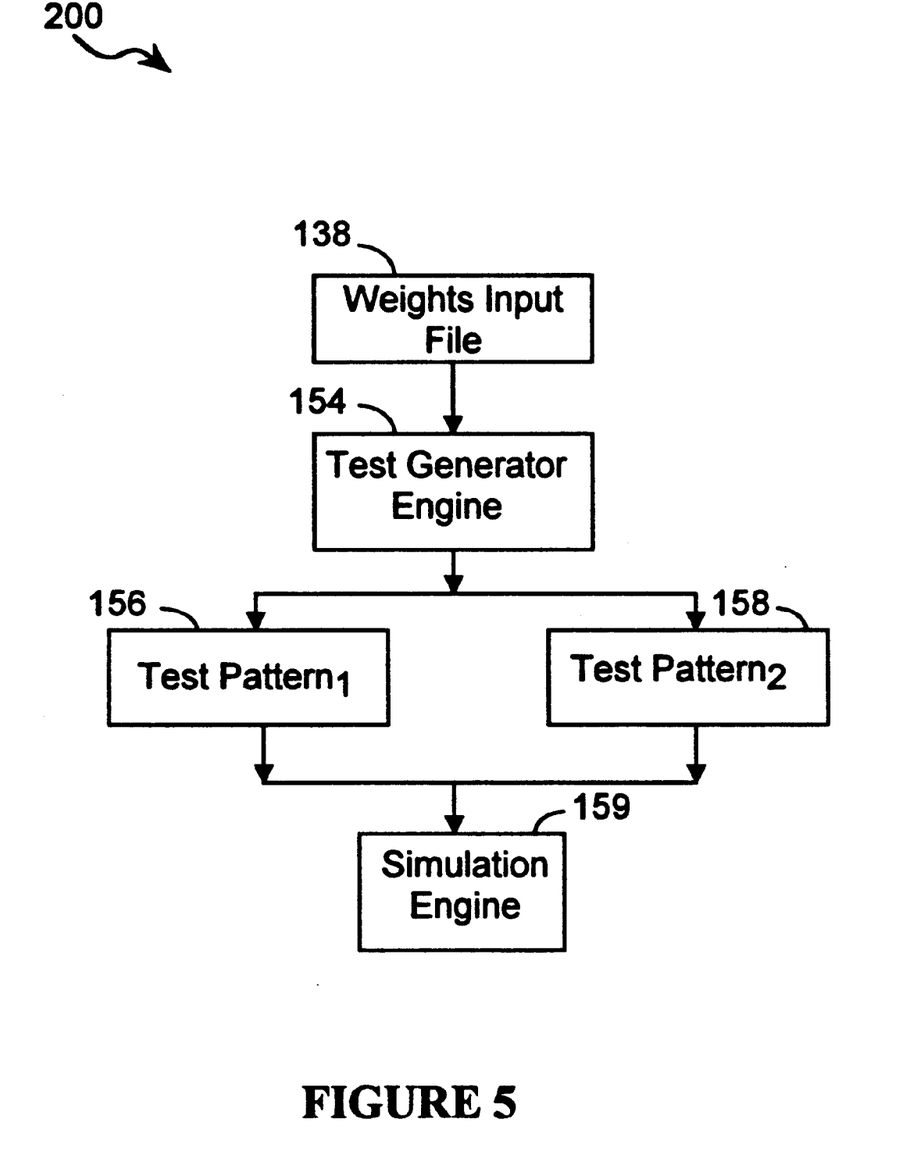
FIG. 5 is a block diagram illustrating the test verification system of an embodiment of the present invention.

FIG. 5 illustrates a processing sequence associated with the test verification system 200 of the present invention. The test verification system 200 includes a test generator engine 154 that is a program written in one of a variety of computer languages that generates test patterns of instructions to verify the functionality of the microprocessor. The test generator engine 154 receives the weights input file 138 and generates two files of test patterns 156, 158. The test pattern files 156, 158 can then be transmitted to a simulation engine 159.

The first test pattern file 156 includes both assembly code representing instructions that test the functionality of the microprocessor and memory initialization and memory mapping data. The memory initialization data initialize certain locations of the microprocessor's memory with test data. The memory mapping data provide the mappings necessary for address translations between virtual and physical addresses. These instructions are typically assembly code instructions associated with the microprocessor's instruction set, and these data are typically in the format associated with the simulation engine environment.

Figure 6:
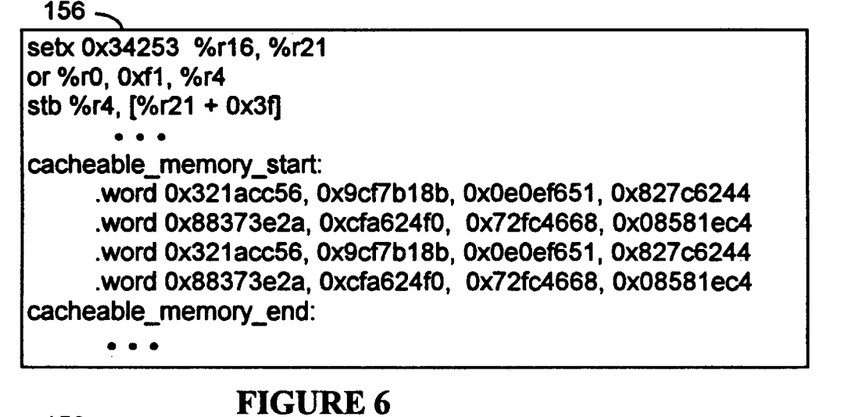
FIG. 6 is an exemplary first test pattern file shown in FIG. 5.

FIG. 6 illustrates such an exemplary test pattern file 156. There is shown three lines of assembly instructions followed by six lines of memory initialization data. The three lines of assembly instructions are used to store a certain byte of data (contents of R4) into a certain area of memory indicated by the contents of R21 and the offset 0x3f. The six lines of memory initialization data initialize a certain section of the cacheable memory.

Figure 7:
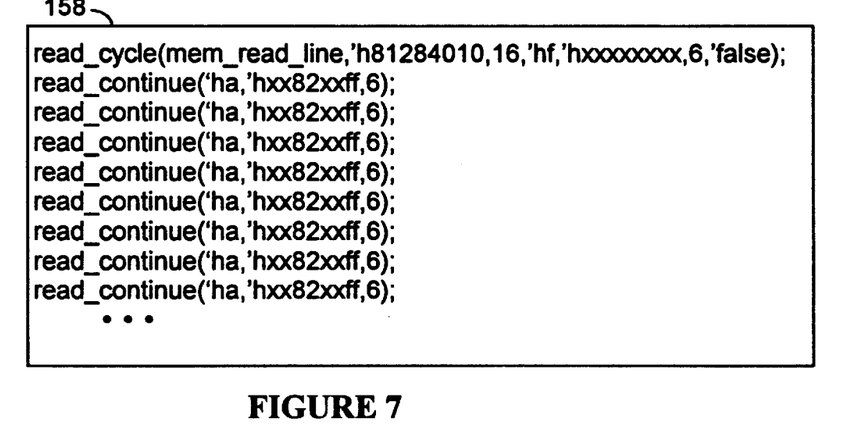
FIG. 7 is an exemplary second test pattern file shown in FIG. 5.

The second test pattern file 158 includes test patterns representing simulation commands used to test the bus traffic on the primary bus. These commands represent the DMA operations between the bus agents on the primary and secondary buses and the microprocessor's memory. FIG. 7 illustrates an exemplary test pattern file 158. There is shown a read_cycle command which is used by the simulation engine to initiate a DMA read request from a bus agent on the primary bus for data stored in the virtual memory address represented as "h81284010." The eight read_continue statements are commands that are used by the simulation engine to predict the response of the bus control unit in completing the DMA operation by returning the requested data to the requesting bus agent, in order to verify that the data being returned is indeed correct.

The test pattern files 156, 158 can then be transmitted to a target microprocessor (not shown) or to a simulation engine 159 that simulates the operation of the microprocessor. The target microprocessor may be any device that processes signals in a computational environment. For example, a microprocessor, a chip set, a mother board, and even a complete computer system with a CPU, memory, etc. constitutes a "target microprocessor" within the meaning of this invention. Further, a target microprocessor may be a software representation written in a hardware design language (e.g., Verilog). The target microprocessor or the simulation engine 159 executes the test patterns thereby generating results that can be compared with expected results.

In an embodiment of the present invention a simulation engine 159 is used which receives the first and second test pattern files 156, 158. The first test pattern file 156 can consist of assembly code instructions that can be assembled before they are loaded into the simulation engine 159. The second test pattern file 158 can consist of simulation commands that are used by the simulation engine 159 to simulate traffic on the primary 110 and secondary bus 116, 118.

Figure 8:
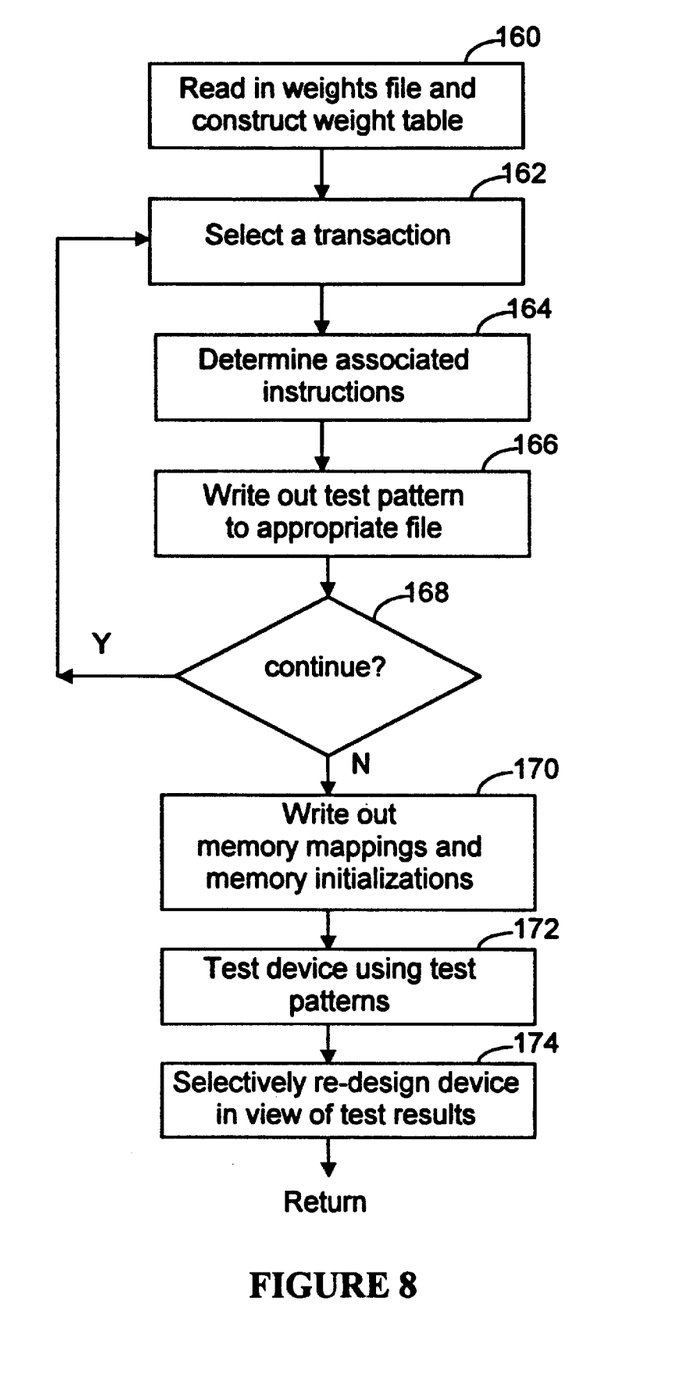
FIG. 8 illustrates the steps used by the test verification system in an embodiment of the present invention.

FIG. 8 illustrates the steps used by the test generator engine 154. The test generator engine 154 receives the weight input file 138 (step 160). The weight input file 138 includes a listing of transactions and their respective weights. From these weights the test generator engine 154 generates an internal weight table storing each transaction with an address range that is used to index the particular transaction. The address range represents the associated weight (step 160). For example, if the weight of a transaction is 50 then an index having an address range of 50 consecutive addresses is associated with the transaction.

Next, a particular transaction is selected (step 162). Preferably, a random number is generated between zero and the sum of all the weights. The random number is then used as an index into the weight table to select a particular transaction. For example, if there are 4 transactions with weights 10, 20, 30, and 40 respectively, the weight table can have indices 0–9 to represent the first transaction, indices 10–29 to represent the second transaction, indices 30–59 to represent the third transaction, and indices 60–99 to represent the fourth transaction. If the randomly generated number is a 75, then the fourth transaction is selected.

Once a transaction is selected, the test generator engine 154 then determines the associated test patterns or instructions that are associated with the selected transaction (step 164). This is performed by means of a look up table or by any other technique.

For example, if a non-cacheable memory transaction is selected, the test generator engine 154 can jump to a place in the program that is earmarked to generate test patterns representing a non-cacheable memory transaction. In this example, the test patterns can be the set of three assembly instructions shown in FIG. 6. These instructions store an intended byte of data in a specified area whose physical address is part of the non-cacheable memory.

In another example, suppose that the transaction selected was prim_m1_dma_cacheable (see FIG. 3) which represents a DMA read operation initiated from the primary bus to the cacheable memory. The associated test patterns can be simulation commands as shown in FIG. 7 which were described above.

The instructions or commands are then written out to the appropriate test pattern file 156, 158 (step 166).

The test generator engine 154 repeats steps 162 through 166 for an intended number of transactions (step 168). When the intended number of transactions have been generated, the test generator engine 154 then writes out the memory initialization and memory mapping instructions as well to the test pattern file 156 (step 170).

Next, the test pattern files 156, 158 are transmitted to a target processor or simulation engine 159 which uses the test pattern files 156, 158 to verify the functionality of the microprocessor (step 172). The results from the verification can be compared with expected results. In some cases, the expected results may differ with the results from the verification. This may cause a redesign of a select portion of the microprocessor (step 174).

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

It should be noted that the present invention is not limited to the particular weighting scheme described and that other biasing methodologies can be employed as well. Furthermore, the present invention is not constrained to verifying the computer system shown in FIGS. 1 and 2. One skilled in the art can easily modify the invention to verify other microprocessor architectures, integrated circuit designs, other types of electronic devices, and the like.

Further, the method and system described hereinabove is amenable for execution on various types of executable mediums other than a memory device such as a random access memory. Other types of executable mediums can be used, such as but not limited to, a computer readable storage medium which can be any memory device, compact disc, or floppy disk.

I claim:

1. An apparatus for generating a plurality of test patterns, said apparatus comprising:

a plurality of transaction data sets, each transaction data set representing one or more instructions, a first subset of said transaction data sets representing direct memory access (DMA) operations between a microprocessor and one or more external processing devices connected to an external bus coupled to said microprocessor;

bias data including a weight representing a frequency for selecting individual transaction data sets of said plurality of transaction data sets; and a test generation engine for generating said test patterns, said test generation engine randomly selecting a selected transaction data set in accordance with said weight and generating corresponding test patterns associated with said selected transaction data set.

2. The apparatus of claim 1, further comprising:

a simulation mechanism that receives said test patterns and executes said test patterns in an environment that simulates said microprocessor.

3. An apparatus for generating a plurality of test patterns, said apparatus comprising:

a plurality of transaction data sets, a first subset of said transaction data sets representing direct memory access (DMA) operations between a microprocessor and one or more external processing devices connected to an external bus coupled to said microprocessor, a second subset of said transaction data sets representing non-DMA memory operations performed by said microprocessor;

bias data indicating a frequency for selecting individual transaction data sets of said plurality of transaction data sets;

a test generation engine for generating said test patterns, said test generation engine randomly selecting a selected transaction data set in accordance with said bias data and generating corresponding test patterns associated with said selected transaction data set;

a first file of test patterns representing said DMA operations; and a second file of test patterns representing said non-DMA operations.

4. The apparatus of claim 3, wherein said first file of test patterns further includes memory initialization test patterns and memory mapping test patterns.

5. A computer readable memory to direct a computer to function in a specified manner, comprising:

a plurality of transaction data sets stored in said memory, each transaction data set representing one or more instructions, a first subset of said transaction data sets representing direct memory access (DMA) operations between a microprocessor and one or more external processing devices connected to an external bus coupled to said microprocessor;

bias data including a weight representing a frequency for selecting individual transaction data sets of said plurality of transaction data sets; and first executable instructions for defining test patterns by randomly choosing a selected transaction data set in accordance with said weight and generating corresponding test patterns associated with said selected transaction data set.

6. The computer readable memory of claim 5, further comprising:

second executable instructions that receive said test patterns and execute said test patterns in an environment that simulates said microprocessor.

7. A computer readable memory to direct a computer to function in a specified manner, comprising:

a plurality of transaction data sets stored in said memory, a first subset of said transaction data sets representing direct memory access (DMA) operations between a microprocessor and one or more external processing devices connected to an external bus coupled to said microprocessor, a second subset of said transaction data sets representing non-DMA memory operations performed by said microprocessor;

bias data indicating a frequency for selecting individual transaction data sets of said plurality of transaction data sets;

first executable instructions for defining test patterns by randomly choosing a selected transaction data set in accordance with said bias data and generating corresponding test patterns associated with said selected transaction data set;

a first file of test patterns representing said DMA operations; and a second file of test patterns representing said non-DMA operations.

8. The computer readable memory of claim 7, wherein said first file of test patterns further includes memory initialization test patterns and memory mapping test patterns.

9. A method for generating test patterns for the functional verification of an integrated circuit design, said method comprising the steps of:

a) providing a plurality of transactions, a first subset of said transactions representing direct memory access (DMA) operations between an integrated circuit and one or more external processing devices connected to an external bus coupled to said integrated circuit;

b) associating with each said transaction, a weight factor indicating a frequency for generating one or more test patterns associated with a particular transaction;

c) randomly selecting a first transaction in accordance with said weight factor; and d) generating one or more test patterns that implement said first transaction.

10. The method of claim 9, further comprising the steps of:

repeating steps c through d for a specified number of times.

11. The method of claim 9, further comprising the steps of:

transmitting said test patterns to a simulation mechanism;

simulating said test patterns in an environment that models said integrated circuit and generates simulated results; and comparing said simulated results with expected results in order to verify the functionality of said integrated circuit.

12. The method of claim 9, said providing step further comprising the step of providing a second subset of said transactions representing memory operations between said integrated circuit and one or more external memory devices coupled to said integrated circuit.

* * * * *